(12) United States Patent
Yamagishi et al.

(10) Patent No.: US 12,046,621 B2
(45) Date of Patent: Jul. 23, 2024

(54) SOLID-STATE IMAGING DEVICE AND ELECTRONIC APPARATUS TO ENHANCE IMAGE QUALITY

(71) Applicant: SONY GROUP CORPORATION, Tokyo (JP)

(72) Inventors: Hajime Yamagishi, Kanagawa (JP); Kiyotaka Tabuchi, Kanagawa (JP); Masaki Okamoto, Kanagawa (JP); Takashi Oinoue, Tokyo (JP); Minoru Ishida, Tokyo (JP); Shota Hida, Nagasaki (JP); Kazutaka Yamane, Kanagawa (JP)

(73) Assignee: SONY GROUP CORPORATION, Tokyo (JP)

( * ) Notice: Subject to any disclaimer, the term of this patent is extended or adjusted under 35 U.S.C. 154(b) by 10 days.

(21) Appl. No.: 17/695,481

(22) Filed: Mar. 15, 2022

(65) Prior Publication Data

US 2022/0278160 A1    Sep. 1, 2022

Related U.S. Application Data

(63) Continuation of application No. 15/559,345, filed as application No. PCT/JP2016/057737 on Mar. 11, 2016, now Pat. No. 11,289,525.

(30) Foreign Application Priority Data

Mar. 25, 2015 (JP) .................................. 2015-061953

(51) Int. Cl.
*H01L 27/146* (2006.01)
*H01L 23/522* (2006.01)
(Continued)

(52) U.S. Cl.
CPC .... *H01L 27/14634* (2013.01); *H01L 23/5225* (2013.01); *H01L 23/5286* (2013.01);
(Continued)

(58) Field of Classification Search
CPC .............................. H01L 23/552; H01L 27/14
See application file for complete search history.

(56) References Cited

U.S. PATENT DOCUMENTS 9,755,029 B1    9/2017 Goktepeli
2003/0002227 A1    1/2003 Jarratt
(Continued)

FOREIGN PATENT DOCUMENTS

CN    102544034 A    7/2012
CN    104078473 A    10/2014
(Continued)

OTHER PUBLICATIONS

International Search Report and Written Opinion of PCT Application No. PCT/JP2016/057737, issued on May 24, 2016, 11 pages of English Translation and 09 pages of ISRWO.
(Continued)

*Primary Examiner* — Suberr L Chi
(74) *Attorney, Agent, or Firm* — CHIP LAW GROUP

(57) ABSTRACT

This technology relates to a solid-state imaging device and an electronic apparatus by which image quality can be enhanced. The solid-state imaging device includes a pixel region in which a plurality of pixels are arranged, a first wiring, a second wiring, and a shield layer. The second wiring is formed in a layer lower than that of the first wiring, and the shield layer is formed in a layer lower at least than that of the first wiring. This technology is applicable to a CMOS image sensor, for example.

11 Claims, 19 Drawing Sheets

(51) Int. Cl.
  *H01L 23/528* (2006.01)
  *H01L 23/552* (2006.01)
  *H01L 27/14* (2006.01)
  *H01L 23/48* (2006.01)
  *H04N 25/616* (2023.01)
  *H04N 25/67* (2023.01)
  *H04N 25/71* (2023.01)
  *H04N 25/75* (2023.01)

(52) U.S. Cl.
  CPC ............ *H01L 23/552* (2013.01); *H01L 27/14* (2013.01); *H01L 27/146* (2013.01); *H01L 27/14623* (2013.01); *H01L 27/14636* (2013.01); *H01L 27/14643* (2013.01); *H01L 23/481* (2013.01); *H01L 27/14627* (2013.01); *H04N 25/616* (2023.01); *H04N 25/67* (2023.01); *H04N 25/745* (2023.01); *H04N 25/75* (2023.01)

(56) References Cited

U.S. PATENT DOCUMENTS

| | | | |
|---|---|---|---|
| 2012/0062777 A1 | 3/2012 | Kobayashi et al. | |
| 2012/0105696 A1 | 5/2012 | Maeda | |
| 2012/0199930 A1 | 8/2012 | Hayashi | |
| 2013/0020468 A1 | 1/2013 | Mitsuhashi et al. | |
| 2014/0284745 A1 | 9/2014 | Seta | |
| 2015/0076526 A1 | 3/2015 | Hidaka et al. | |
| 2016/0190198 A1* | 6/2016 | Kwon ................. | H01L 27/1464 257/435 |

FOREIGN PATENT DOCUMENTS

| | | |
|---|---|---|
| JP | 09-326587 A | 12/1997 |
| JP | 2009-283843 A | 12/2009 |
| JP | 2012-064709 A | 3/2012 |
| JP | 2012-094720 A | 5/2012 |
| JP | 2014-187261 A | 10/2014 |
| JP | 2015-056590 A | 3/2015 |
| KR | 10-2012-0044246 A | 5/2012 |
| TW | 201218363 A | 5/2012 |
| TW | 201438212 A | 10/2014 |

OTHER PUBLICATIONS

International Preliminary Report on Patentability of PCT Application No. PCT/JP2016/057737, issued on Oct. 5, 2017, 11 pages of English Translation and 06 pages of IPRP.

Notice of Allowance for U.S. Appl. No. 15/559,345, issued on Nov. 29, 2021, 08 pages.

Advisory Action for U.S. Appl. No. 15/559,345, issued on Jan. 26, 2021, 03 pages.

Advisory Action for U.S. Appl. No. 15/559,345, issued on Mar. 25, 2020, 02 pages.

Final Office Action for U.S. Appl. No. 15/559,345, issued on May 16, 2019, 11 pages.

Final Office Action for U.S. Appl. No. 15/559,345, issued on Nov. 9, 2020, 16 pages.

Final Office Action for U.S. Appl. No. 15/559,345, issued on Feb. 4, 2020, 07 pages.

Non-Final Office Action for U.S. Appl. No. 15/559,345, issued on Jun. 7, 2021, 13 pages.

Non-Final Office Action for U.S. Appl. No. 15/559,345, issued on May 7, 2020, 15 pages.

Non-Final Office Action for U.S. Appl. No. 15/559,345, issued on Aug. 7, 2019, 13 pages.

Non-Final Office Action for U.S. Appl. No. 15/559,345, issued on Dec. 20, 2018, 13 pages.

* cited by examiner

FIG. 4

| MATERIAL | RELATIVE PERMEABILITY |
|---|---|
| COBALT | 250 |
| NICKEL | 600 |
| SOFT IRON | 2,000 |
| IRON | 5,000 |
| SILICON STEEL | 7,000 |
| MU-METAL | 100,000 |
| PERMALLOY | 100,000 |
| PURE IRON | 200,000 |
| SUPERMALLOY | 1,000,000 |

SOLID-STATE IMAGING DEVICE AND ELECTRONIC APPARATUS TO ENHANCE IMAGE QUALITY

CROSS REFERENCE TO RELATED APPLICATIONS

This application is a continuous application of U.S. patent application Ser. No. 15/559,345, filed on Sep. 18, 2017, which is a national stage entry of PCT application No. PCT/JP2016/057737 filed on Mar. 11, 2016, which claims priority benefit of Japanese Patent Application No. JP 2015-061953 filed in the Japan Patent Office on Mar. 25, 2015. Each of the above-referenced applications is hereby incorporated herein by reference in its entirety.

TECHNICAL FIELD

The present invention relates to a solid-state imaging device and an electronic apparatus, particularly to a solid-state imaging device and an electronic apparatus by which image quality can be enhanced.

BACKGROUND ART

In recent years, digital cameras have been spreading more and more. Attendant on this, the demand for solid-state imaging devices (image sensors) as a central part of digital cameras has been growing more and more. In a performance aspect of solid-state imaging devices, technical developments have been under way for realizing higher image quality and higher functions.

On the other hand, the spread of portable terminals (mobile phones, personal digital assistants (PDAs), notebook type personal computers (PCs), tablet PCs, etc.) having an imaging function has also been progressing. Attendant on this, reductions in size, weight and thickness of solid-state imaging devices and their component parts have been advanced for the purpose of enhancing the portability of these portable terminals. Furthermore, for spread and extension of these portable terminals, reductions of the solid-state imaging devices and their component parts in cost have also been under way.

In general, a solid-state imaging device (for example, a metal oxide semiconductor (MOS) type solid-state imaging device) is configured by forming a photoelectric conversion section, an amplification circuit and a multilayer wiring layer on a light reception surface side of a silicon substrate and forming color filters and on-chip microlenses over them. Further, a cover glass is laminated onto the light reception surface side through a spacer such as an adhesive. In addition, a terminal is formed on the side opposite to the light reception surface.

To the solid-state imaging device is connected a signal processing circuit which applies predetermined processing to a signal outputted. An increase in the number of functions of the solid-state imaging device tends to be accompanied by an increase in the processing carried out by the signal processing circuit.

For reducing the size of the configuration wherein a plurality of chips are thus connected, various means have been taken. For example, sealing of a plurality of chips into a single package is performed by the system in package (SiP) technology. By this, the mounting area can be reduced, and a reduction in the overall configuration size can be realized. According to the SiP, however, the wiring for connection between the chips elongates the transmission distance, which may hamper high-speed operations.

Meanwhile, PTL 1, for example, describes a solid-state imaging device having a configuration wherein a first semiconductor substrate including a pixel region and a second semiconductor substrate including a logic circuit are bonded to each other by lamination. According to such a configuration, high-speed transmission of signals can be achieved.

CITATION LIST

Patent Literature

[PTL 1]
JP 2012-64709 A

SUMMARY

Technical Problem

Meanwhile, in the solid-state imaging device of PTL 1, in the case of contriving enhancement of functions of the logic circuit provided in the second semiconductor substrate, the logic circuit should be driven with a large current and at a high frequency.

In the solid-state imaging device of PTL 1, however, the pixel region and the logic circuit are formed at close range. Therefore, a magnetic field generated at a wiring (particularly, a power supply line) of the logic circuit is exerted on pixel wirings (particularly, signal lines) in the pixel region, whereby eddy currents would be generated. As a result, noises would be generated in the image obtained.

The present technology has been made in consideration of the above-mentioned circumstances, and aims at enhancing image quality.

Solution to Problem

In an aspect of the present technology, there is provided a solid-state imaging device including a pixel region in which a plurality of pixels are arranged, a first wiring, a second wiring, and a shield layer. The second wiring is formed in a layer lower than that of the first wiring, and the shield layer is formed in a layer lower at least than that of the first wiring.

The shield layer may be formed from a material having a relative permeability of not less than 100.

The shield layer may be formed between the first wiring and the second wiring.

The solid-state imaging device may further include a laminated body in which a first semiconductor substrate and one or more second semiconductor substrates are laminated, with the first semiconductor substrate as an uppermost layer, and a configuration may be adopted wherein the first semiconductor substrate has the pixel region and the first wiring, and the second semiconductor substrate has the second wiring and a logic circuit.

A fixed potential may be impressed on the shield layer.

The shield layer may be formed in the first semiconductor substrate, and connected to a ground (GND) of the first semiconductor substrate.

The shield layer may be formed in the second semiconductor substrate, and connected to a GND of the second semiconductor substrate.

A configuration may be adopted wherein the first semiconductor substrate has a first electrode connected to the first wiring, on a surface on the second semiconductor substrate side, the second semiconductor substrate has a second electrode connected to the second wiring, at a position on a surface on the first semiconductor substrate side which position corresponds to the first electrode, the first electrode and the second electrode electrically connect the first semiconductor substrate and the second semiconductor substrate, and the shield layer is formed in such a manner as to be penetrated by the first electrode or the second electrode.

The shield layer may be formed in a flat film shape having an area substantially equal to or greater than that of the pixel region.

The shield layer may be formed in the second semiconductor substrate in such a manner as to cover the second wiring from above.

The shield layer may be formed in a layer lower than that of the second wiring.

The shield layer may be formed in such a manner as to make contact with a lower surface of the second wiring.

The shield layer may be formed in a state of being divided into a plurality of portions in a same layer.

The shield layer may have a hole formed in part thereof.

The shield layer may have a function as an electromagnetic shield. In an aspect of the present technology, there is provided an electronic apparatus including a solid-state imaging device. The solid-state imaging device includes a pixel region in which a plurality of pixels are arranged, a first wiring, a second wiring, and a shield layer. The second wiring is formed in a layer lower than that of the first wiring, and the shield layer is formed in a layer lower at least than that of the first wiring.

In an aspect of the present technology, there are provided a pixel region in which a plurality of pixels are arranged, a first wiring, a second wiring, and a shield layer, wherein the second wiring is formed in a layer lower than that of the first wiring, and the shield layer is formed in a layer lower at least than that of the first wiring.

Advantageous Effect of Invention

According to an aspect of the present technology, it becomes possible to enhance image quality.

BRIEF DESCRIPTION OF DRAWINGS

FIG. 4 is a flow chart for explaining materials for a shield layer.

DESCRIPTION OF EMBODIMENTS

Figure 1:
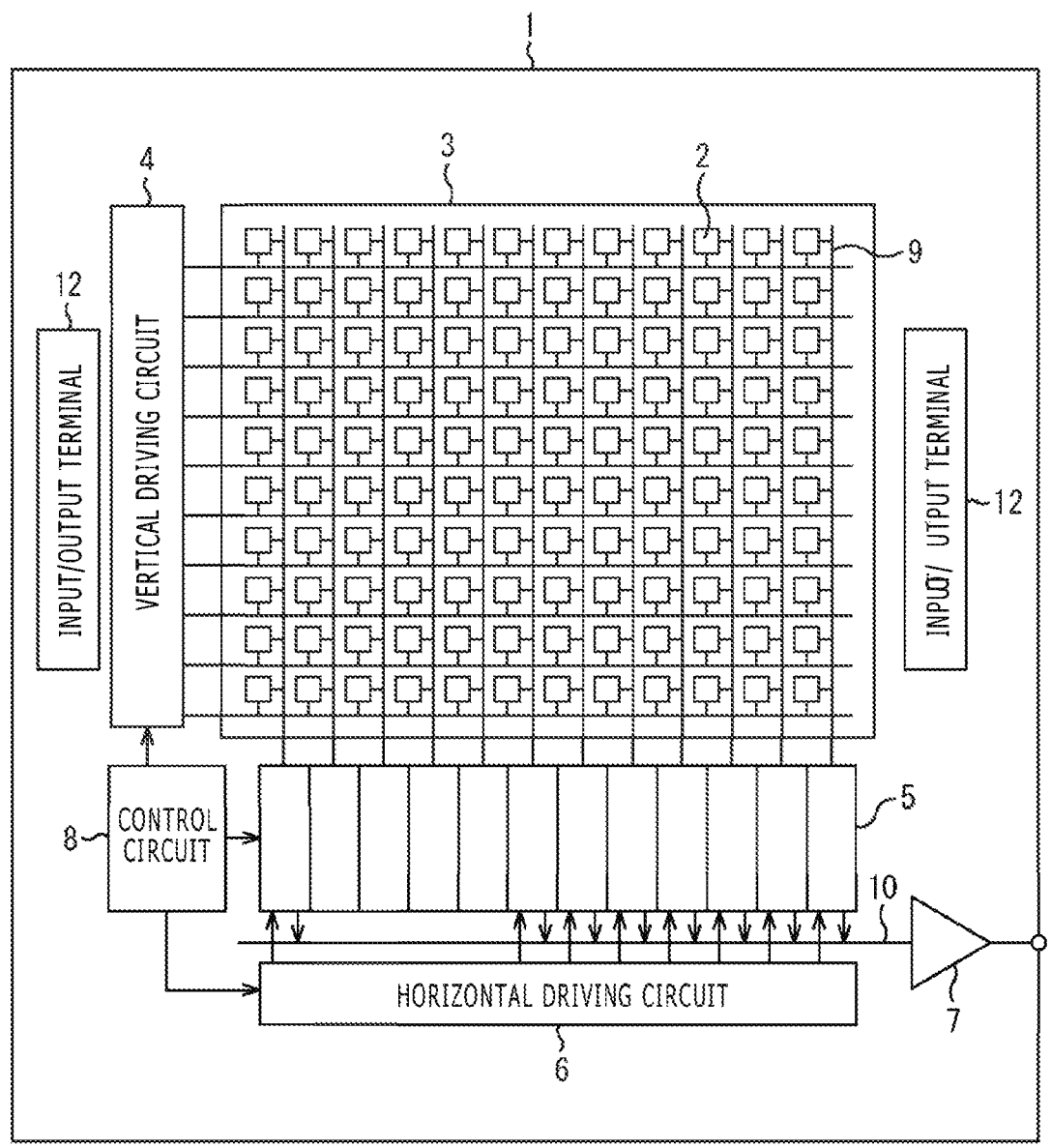
FIG. 1 is a block diagram depicting a configuration example of a solid-state imaging device according to the present technology.

Embodiments of the present technology will be described below referring to the drawings.

<Configuration of Solid-State Imaging Device>

FIG. 1 is a block diagram depicting a configuration example of a solid-state imaging device according to the present technology.

A solid-state imaging device 1 is configured as a complementary metal oxide semiconductor (CMOS) image sensor. The solid-state imaging device 1 includes a pixel region (pixel array) 3 in which a plurality of pixels 2 are regularly arranged in a two-dimensional array on a semiconductor substrate (for example, a Si substrate) (not depicted), and a peripheral circuit section.

The pixel 2 includes a photoelectric conversion section (for example, photodiode) and a plurality of pixel transistors (MOS transistors). The plurality of pixel transistors may include, for example, three transistors, specifically, a transfer transistor, a reset transistor, and an amplification transistor. Besides, the plurality of pixel transistors may include four transistors by adding a selection transistor to the three transistors. Note that an equivalent circuit for a unit pixel is the same as an ordinary one, and, hence, detailed description thereof is omitted.

In addition, the pixel 2 may be configured as a single unit pixel, or may be of a pixel sharing structure. The pixel sharing structure is a structure in which a plurality of photodiodes share a floating diffusion and other transistors than the transfer transistors.

The peripheral circuit section includes a vertical driving circuit 4, a column signal processing circuit 5, a horizontal driving circuit 6, an output circuit 7, and a control circuit 8.

The control circuit 8 receives an input clock and data for commanding an operation mode or the like, and outputs data such as internal information concerning the solid-state imaging device 1. In addition, based on a vertical synchronizing signal, a horizontal synchronizing signal, and a master clock, the control circuit 8 generates a clock signal and control signals which constitute a basis for operations of the vertical driving circuit 4, the column signal processing circuit 5 and the horizontal driving circuit 6, etc. Then, the control circuit 8 inputs these signals to the vertical driving circuit 4, the column signal processing circuit 5, and the horizontal driving circuit 6, etc.

The vertical driving circuit 4 includes, for example, a shift register. The vertical driving circuit 4 selects a pixel driving wiring, supplies the selected pixel driving wiring with pulses for driving the pixels, and drives the pixels on a row basis. Specifically, the vertical driving circuit 4 selectively scans the pixels 2 in the pixel region 3 sequentially in a vertical direction on a row basis. Besides, the vertical driving circuit 4 supplies the column signal processing circuit 5 with a pixel signal based on signal charges generated according to light reception amounts in the photoelectric conversion sections of the pixels 2, through vertical signal lines 9.

The column signal processing circuits 5 are arranged on the basis of, for example, each column of the pixels 2. The column signal processing circuits 5 apply signal processing such as noise removal to signals outputted from the pixels 2 for one row, on a pixel column basis. Specifically, the column signal processing circuits 5 perform signal processing such as correlated double sampling (CDS) for removal of fixed pattern noises intrinsic of the pixels 2, signal amplification, and analog/digital (A/D) conversion. An output stage of the column signal processing circuit 5 is provided with a horizontal selection switch (not depicted) in connection with and between the output stage and a horizontal signal line 10.

The horizontal driving circuit 6 includes, for example, a shift register. By sequentially outputting horizontal scanning pulses, the horizontal driving circuit 6 sequentially selects the column signal processing circuits 5, and causes pixel signals to be outputted from the column signal processing circuits 5 to the horizontal signal line 10.

The output circuit 7 applies signal processing to signals sequentially supplied from the column signal processing circuits 5 through the horizontal signal line 10, and outputs the processed signals. The output circuit 7 may perform only buffering, for example, or may perform black level adjustment, column variability correction, various kinds of digital signal processing, and the like.

An input/output terminal 12 transfers signals to and from the exterior.

<Structure of Solid-state Imaging Device>

Now, the structure of a solid-state imaging device to which the present technology is applied will be described below.

Figure 2:
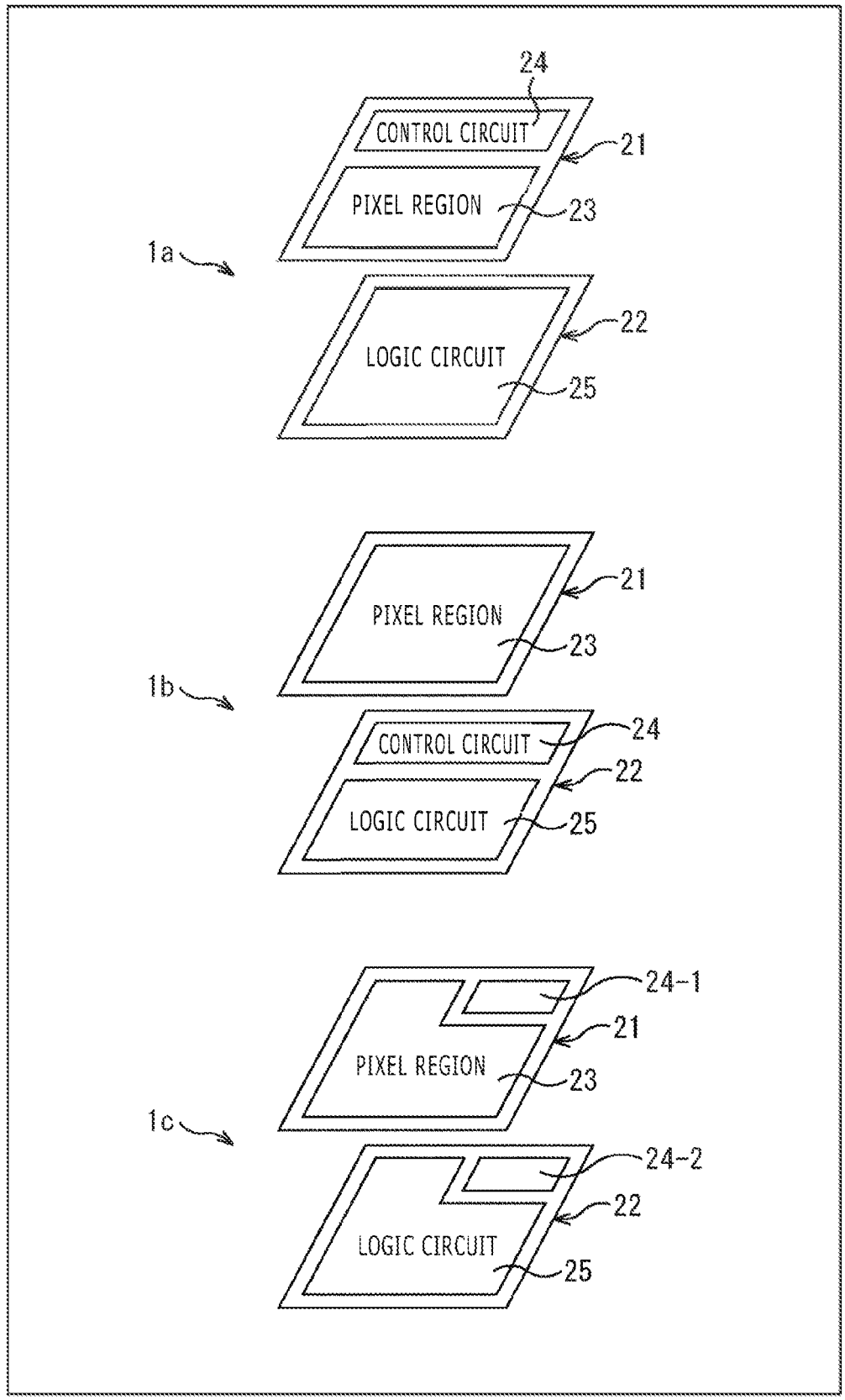
FIG. 2 illustrates the structure of the solid-state imaging device.

As a first example, a solid-state imaging device 1a depicted at the top of FIG. 2 includes a first semiconductor substrate 21 and a second semiconductor substrate 22. A pixel region 23 and a control circuit 24 are mounted on the first semiconductor substrate 21. A logic circuit 25 including a signal processing circuit is mounted on the second semiconductor substrate 22. The first semiconductor substrate 21 and the second semiconductor substrate 22 are electrically connected to each other, whereby the solid-state imaging device 1a *is configured as a single semiconductor chip.*

As a second example, a solid-state imaging device 1b depicted in the middle of FIG. 2 includes a first semiconductor substrate 21 and a second semiconductor substrate 22. A pixel region 23 is mounted on the first semiconductor substrate 21. A control circuit 24 and a logic circuit 25 including a signal processing circuit are mounted on the second semiconductor substrate 22. The first semiconductor substrate 21 and the second semiconductor substrate 22 are electrically connected to each other, whereby the solid-state imaging device 1b is configured as a single semiconductor chip.

As a third example, a solid-state imaging device 1c depicted at the bottom of FIG. 2 includes a first semiconductor substrate 21 and a second semiconductor substrate 22. A pixel region 23 and a control circuit 24-1 for controlling the pixel region 23 are mounted on the first semiconductor substrate 21. A control circuit 24-2 for controlling a logic circuit 25 and the logic circuit 25 including a signal processing circuit are mounted on the second semiconductor substrate 22. The first semiconductor substrate 21 and the second semiconductor substrate 22 are electrically connected to each other, whereby the solid-stage imaging device 1c is configured as a single semiconductor chip.

First Embodiment

Figure 3:
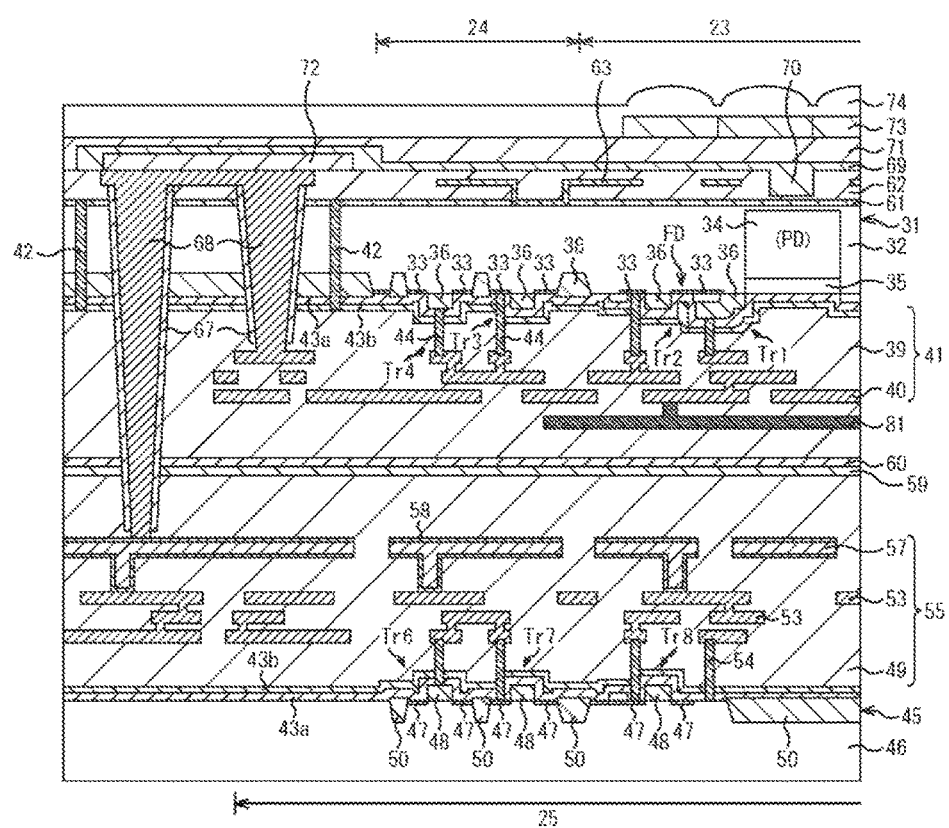
FIG. 3 is a sectional view depicting a configuration example of a solid-state imaging device according to a first embodiment.

FIG. 3 is a sectional view of a solid-state imaging device 1 according to a first embodiment of the present technology.

While detailed description will be made later, the solid-state imaging device 1 according to this embodiment depicted in FIG. 3 is configured as a laminated body wherein a first semiconductor wafer 31 including a pixel region 23 and a second semiconductor wafer 45 including a logic circuit are laminated, with the first semiconductor wafer 31 as an upper layer, like the solid-state imaging device 1a of FIG. 2.

The first semiconductor wafer 31 is laminated onto the second semiconductor wafer 45, with its back side up. In other words, the solid-state imaging device 1 is a laminated, back side irradiation type solid-state imaging device.

The first semiconductor wafer 31 is formed, on the front side (the lower side in the figure) thereof, with a multilayer wiring layer 41 including a plurality of wirings 40. The wirings 40 function as signal lines for transmitting pixel signals outputted from pixels formed in the pixel region 23.

The second semiconductor wafer 45 is formed, on the front side (the upper side in the figure) thereof, with a multilayer wiring layer 55 including a plurality of wirings 53 and a wiring 57 having a barrier metal layer 58. The wiring 57 functions as a power supply line connected to a power supply of the second semiconductor wafer 45.

In addition, the first semiconductor wafer 31 and the second semiconductor wafer 45 are laminated, with their multilayer wiring layer 41 and multilayer wiring layer 55 facing each other, through an adhesive layer 60 therebetween.

Further, the first semiconductor wafer 31 and the second semiconductor wafer 45 are electrically connected together through connection conductors 68.

Specifically, a connection hole is formed which penetrates a semiconductor well region 32 of the first semiconductor wafer 31 and reaches a required one of the wirings 40 in the multilayer wiring layer 41. In addition, a connection hole is formed which penetrates the semiconductor well region 32 and an interlayer insulating film 39 of the first semiconductor wafer 31 and reaches a required one of the wirings 57 in the multilayer wiring layer 55 of the second semiconductor wafer 45. In these connection holes are buried the connection conductors 68, which are connected together at their ends on one side. By this, the first semiconductor wafer 31 and the second semiconductor wafer 45 are electrically connected together.

The periphery of the connection conductors 68 is covered with an insulating film 67 for insulation from the semiconductor well region 32. The connection conductors 68 are connected to an electrode pad which is not depicted. Note that the connection conductors 68 may be formed such that an upper portion thereof is configured as an electrode pad.

Furthermore, the first semiconductor wafer 31 is formed with a shield layer 81 on the front side (the lower side in the figure) of the multilayer wiring layer 41 including the plurality of wirings 40.

The shield layer 81 is formed from a material having a sufficiently high relative permeability. In other words, the shield layer 81 has a function as a magnetic shield. For example, the shield layer 81 is formed as a monolayer film of permalloy (Fe—Ni) having a relative permeability of 100,000. Besides, the shield layer 81 may be formed as a stacked film wherein permalloy and a Ta-based or Ti-based high-melting-point metal are stacked.

The shield layer 81 may be formed from a material other than permalloy. Specifically, it is sufficient for the shield layer 81 to be formed from a material having a relative permeability of not less than 100, preferably not less than 1,000. For example, as depicted in FIG. 4, the shield layer 81 can be formed from cobalt (relative permeability: 250), nickel (relative permeability: 600), soft iron (relative permeability: 2,000), iron (relative permeability: 5,000), silicon steel (relative permeability: 7,000), Mu-metal (relative permeability: 100,000), pure iron (relative permeability: 200,000), supermalloy (relative permeability: 1,000,000), or the like.

In addition, the shield layer 81 is formed to have a film thickness of not less than 5 nm, preferably not less than 20 nm. With the film thickness of the shield layer 81 set to an appropriate film thickness, a shielding effect such as to lower induced electric power by approximately one order of magnitude can be obtained owing to the magnetic shield function of the shield layer 81.

Further, the shield layer 81 is formed in a flat film shape having an area substantially equal to or greater than that of the pixel region 23. In other words, the shield layer 81 is formed in such a manner that the pixel region 23 is hidden behind the shield layer 81 when viewed from the second semiconductor wafer 45 side.

Furthermore, a fixed potential is impressed on the shield layer 81. For example, the GND of the first semiconductor wafer 31 is connected to the shield layer 81. Specifically, the shield layer 81 is connected to a GND wiring of the first semiconductor wafer 31 through a plurality of via holes.

According to such a configuration, a magnetic field generated at the wiring 57 serving as a power supply line of the second semiconductor wafer 45 is shielded by the shield layer 81, so that the magnetic field can be prevented from being exerted on the wirings 40 in the pixel region 23 of the first semiconductor wafer 31. As a result, generation of noises in an image obtained can be avoided, and image quality can be enhanced.

In addition, in the case where GND level varies, the first semiconductor wafer 31 which deals with analog signals is more susceptible to bad influences of the variations than the logic circuit of the second semiconductor wafer 45. In view of this, the shield layer 81 is connected to the GND of the first semiconductor wafer 31, whereby the impedance of the GND in the first semiconductor wafer 31 can be lowered. As a result, the influences from the logic circuit which is driven with a large current and at a high frequency can be reduced more.

Note that it is sufficient that a fixed potential is impressed on the shield layer 81. Therefore, the shield layer 81 may be connected, for example, to a power supply of the first semiconductor wafer 31, a power supply for the pixels 2 formed in the pixel region 23, or the like.

Second Embodiment

Figure 5:
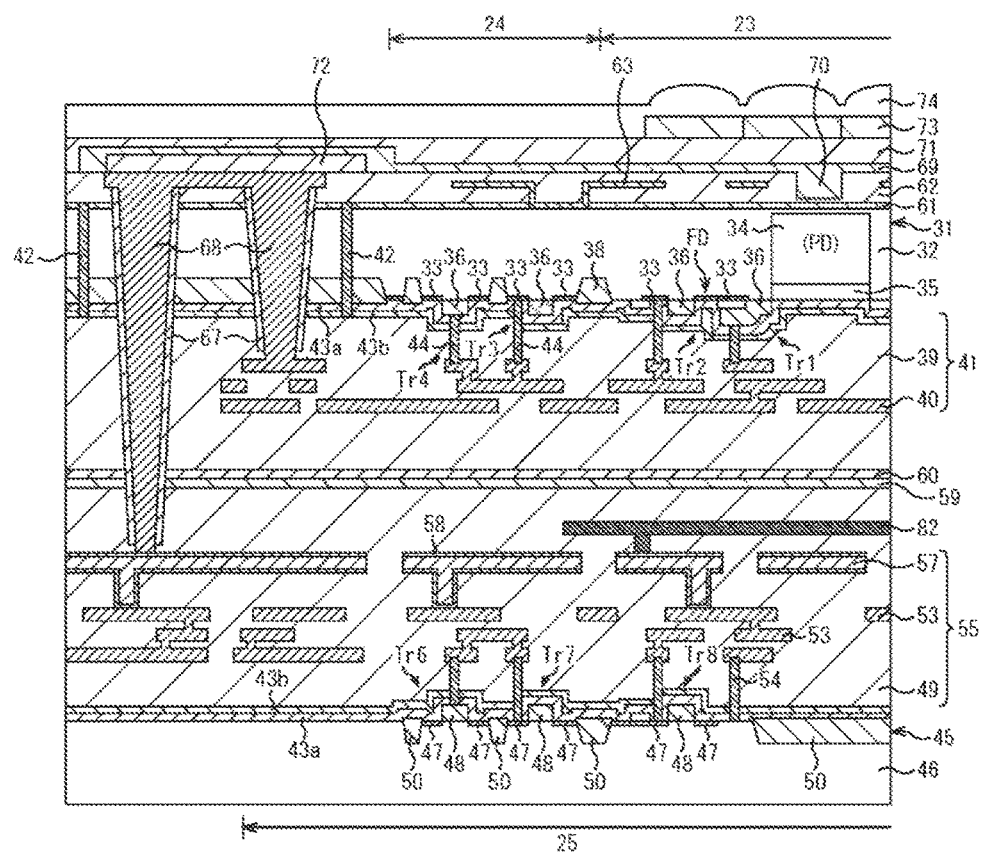
FIG. 5 is a sectional view depicting a configuration example of a solid-state imaging device according to a second embodiment.

FIG. 5 is a sectional view of a solid-state imaging device 1 according to a second embodiment of the present technology.

The solid-state imaging device 1 depicted in FIG. 5, basically, has the same configuration as that of the solid-state imaging device 1 depicted in FIG. 3. In the solid-state imaging device 1 of FIG. 5, a second semiconductor wafer 45 is formed with a shield layer 82, in place of the shield layer 81 of FIG. 3.

Specifically, the second semiconductor wafer 45 is formed with the shield layer 82 on the front side (the upper side in the figure) of a multilayer wiring layer 55 including a plurality of wirings 53 and a wiring 57.

Note that the material and film thickness of the shield layer 82 are the same as those of the shield layer 81 of FIG. 3.

The shield layer 82 is formed in a flat film shape having an area substantially equal to or greater than that of a pixel region 23. In other words, the shield layer 82 is formed in such a manner that the pixel region 23 is hidden behind the shield layer 82 when viewed from the multilayer wiring layer 55 side.

In addition, a fixed potential is impressed on the shield layer 82. For example, the shield layer 82 is connected to a GND of the second semiconductor layer 45. Specifically, the shield layer 82 is connected to a GND wiring of the second semiconductor wafer 45 through a plurality of via holes.

According to such a configuration, a magnetic field generated at the wiring 57 serving as a power supply line of the second semiconductor wafer 45 is shielded by the shield layer 82, so that the magnetic field can be prevented from being exerted on a multilayer wiring layer 41 of a first semiconductor wafer 31. As a result, generation of noises in an image obtained can be avoided, and image quality can be enhanced.

Besides, the second semiconductor wafer 45 having a logic circuit has a larger current consumption than that of the first semiconductor wafer 31. In view of this, the shield layer 82 is connected to the GND of the second semiconductor wafer 45, whereby the impedance of the GND in the second semiconductor wafer 45 can be lowered.

Note that it is sufficient that a fixed potential is impressed on the shield layer 82. Therefore, the shield layer 82 may be connected, for example, to a power supply of the second semiconductor wafer 45, or the like.

Third Embodiment

Figure 6:
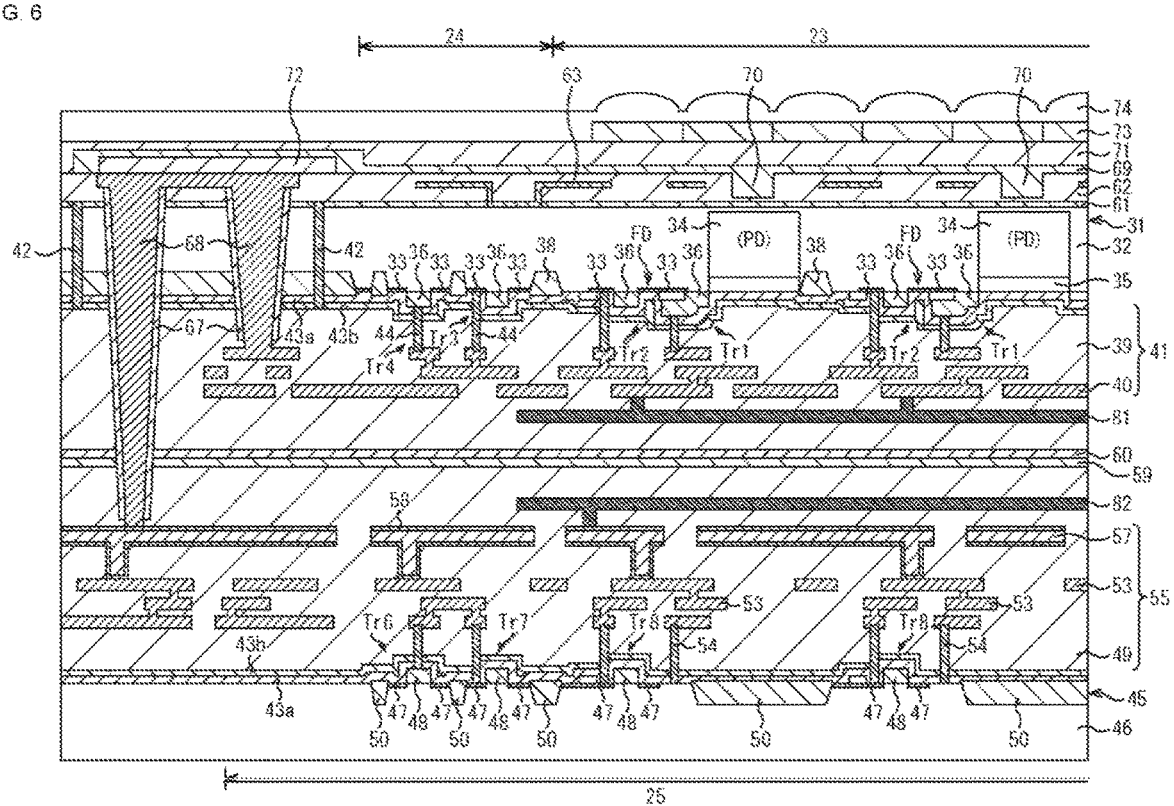
FIG. 6 is a sectional view depicting a configuration example of a solid-state imaging device according to a third embodiment.

FIG. 6 is a sectional view of a solid-state imaging device 1 according to a third embodiment of the present technology.

The solid-state imaging device 1 depicted in FIG. 6, fundamentally, has the same configuration as that of the solid-state imaging device 1 depicted in FIG. 3. In the solid-state imaging device 1 of FIG. 6, the shield layer 82 described referring to FIG. 5 is formed, in addition to the configuration of FIG. 3.

According to such a configuration, a magnetic field generated at a wiring 57 serving as a power supply line of a second semiconductor wafer 45 is shielded by the shield layers 81 and 82, so that the magnetic field can be prevented from being exerted on a multilayer wiring layer 41 of a first semiconductor wafer 31. As a result, generation of noises in an image obtained can be avoided, and image quality can be enhanced.

Note that in the example of FIG. 6, in a pixel region 23, the number of via holes formed for connection between the shield layer 81 and a GND wiring of the first semiconductor wafer 31 is greater than the number of via holes formed for connection between the shield layer 82 and a GND wiring of the second semiconductor wafer 45. As a result, an effect of lowering the impedance of the GND in the first semiconductor wafer 31 can be obtained more assuredly.

Figure 7:
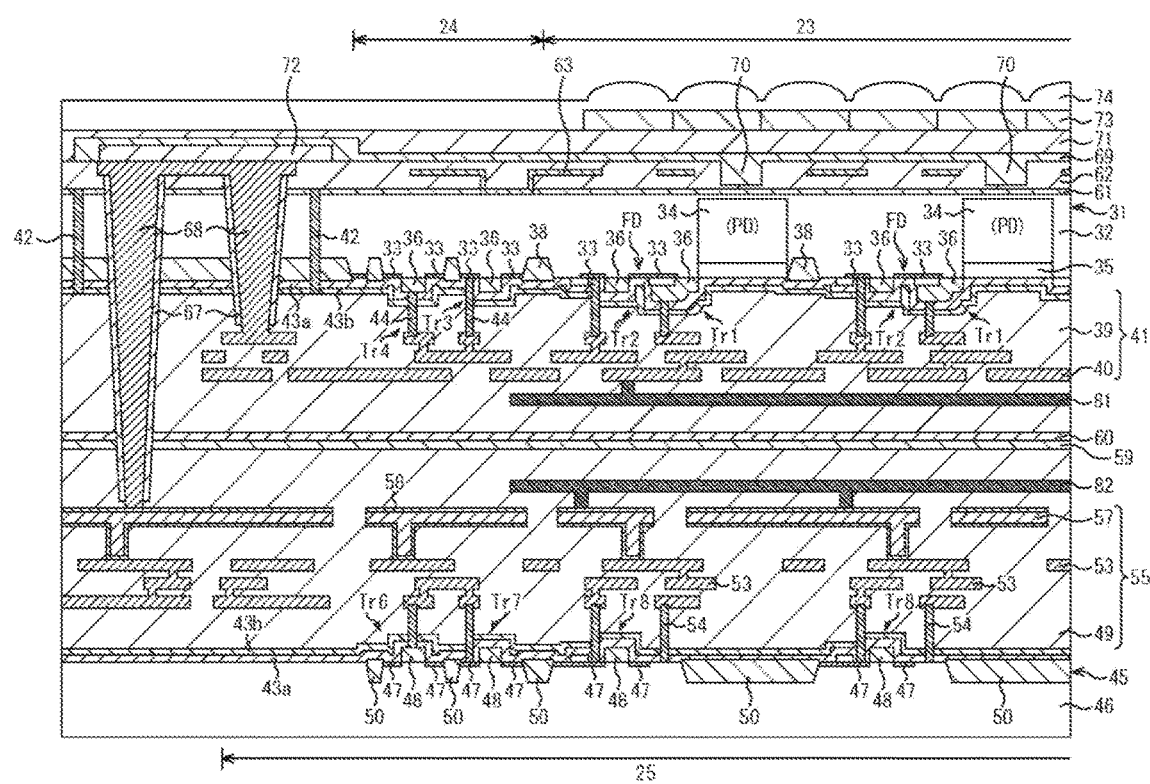
FIG. 7 is a sectional view depicting another configuration example of the solid-state imaging device according to the third embodiment.

In addition, as depicted in FIG. 7, in the pixel region 23, the number of via holes formed for connection between the shield layer 82 and the GND wiring of the second semiconductor wafer 45 may be greater than the number of via holes formed for connection between the shield layer 81 and the GND wiring of the first semiconductor wafer 31.

By this, an effect of further lowering the impedance of the GND in the second semiconductor wafer 45 can be obtained more securely.

Fourth Embodiment

Figure 8:
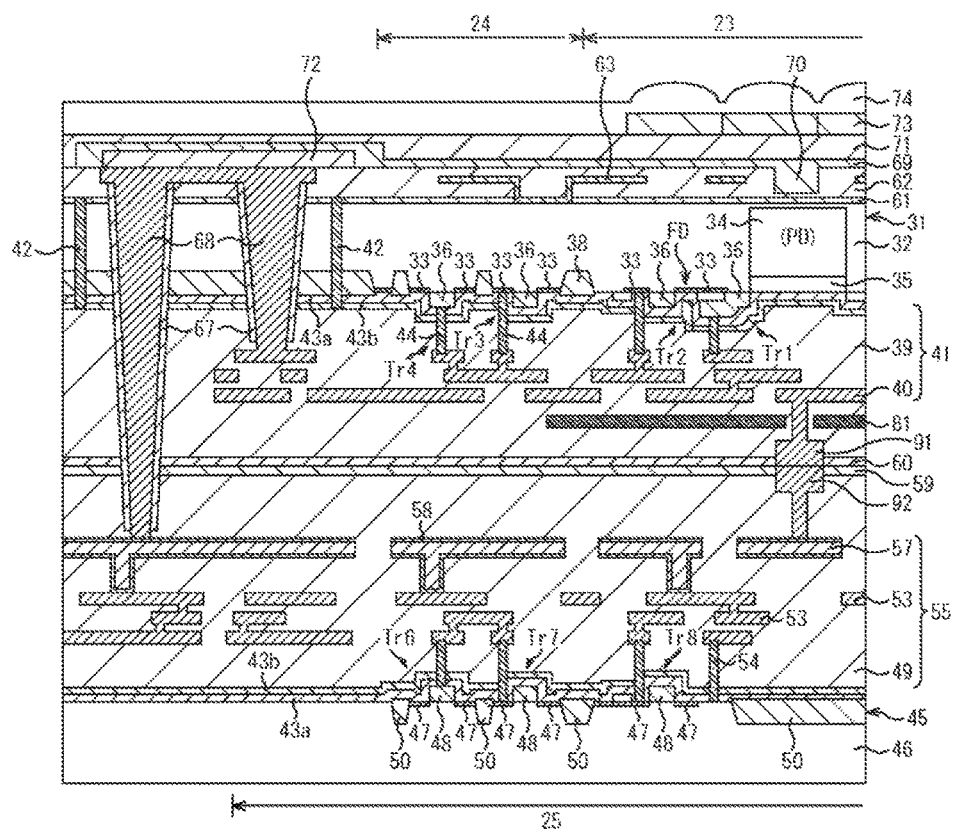
FIG. 8 is a sectional view depicting a configuration example of a solid-state imaging device according to a fourth embodiment.

FIG. 8 is a sectional view of a solid-state imaging device 1 according to a fourth embodiment of the present technology.

The solid-state imaging device 1 depicted in FIG. 8, basically, has the same configuration as that of the solid-state imaging device 1 depicted in FIG. 3. In the solid-state imaging device 1 of FIG. 8, a first semiconductor wafer 31 is formed with a Cu electrode 91, and a second semiconductor wafer 45 is formed with a Cu electrode 92, in addition to the configuration of FIG. 3.

The Cu electrode 91 is formed in the first semiconductor wafer 31 on a surface on the second semiconductor wafer 45 side, and is connected to wirings 40 of a multilayer wiring layer 41.

On the other hand, the Cu electrode 92 is formed in the second semiconductor wafer 45 on a surface on the first semiconductor wafer 31 side at a position corresponding to the Cu electrode 91, and is connected to a wiring 57 in a multilayer wiring layer 55.

The Cu electrode 91 and the Cu electrode 92 are electrically connected together by lamination of the first semiconductor wafer 31 and the second semiconductor wafer 45. In other words, the Cu electrode 91 and the Cu electrode 92 electrically connect the first semiconductor wafer 31 and the second semiconductor wafer 45 to each other.

In addition, in the configuration of FIG. 8, a shield layer 81 is formed in such a manner as to be penetrated by the Cu electrode 91. While one Cu electrode 91 and one Cu electrode 92 are only depicted in FIG. 8, they are actually provided in pluralities. In other words, the shield layer 81 has a plurality of through-holes. Besides, though not illustrated, the shield layer 81 is not connected to a GND of the first semiconductor wafer 31 in the inside of a pixel region 23 but is connected to the GND of the first semiconductor wafer 31 in the outside of the pixel region 23.

According to such a configuration, a magnetic field generated at the wiring 57 serving as a power supply line of the second semiconductor wafer 45 is shielded by the shield layer 81, so that the magnetic field can be prevented from being exerted on a multilayer wiring layer 41 of the first semiconductor wafer 31. As a result, generation of noises in an image obtained can be obviated, and image quality can be enhanced.

In addition, with the shield layer 81 not connected to the GND of the first semiconductor wafer 31 in the pixel region 23, radiation noises which would be generated around the through-holes due to passage of a GND current in the case where the shield layer 81 is connected to the GND can be restrained.

Note that while the Cu electrode 91 and the Cu electrode 92 are provided in addition to the configuration of FIG. 3 in the example of FIG. 8, the Cu electrodes may be provided in addition to the configuration of FIG. 5 or the configuration of FIG. 6 or 7. In that case, also, the shield layer 81 and the shield layer 82 are not connected to the GND of the first semiconductor wafer 31 or the second semiconductor wafer 45 in the inside of the pixel region 23 but are connected to the GND of the first semiconductor wafer 31 or the second semiconductor wafer 45 in the outside of the pixel region 23.

Fifth Embodiment

Figure 9:
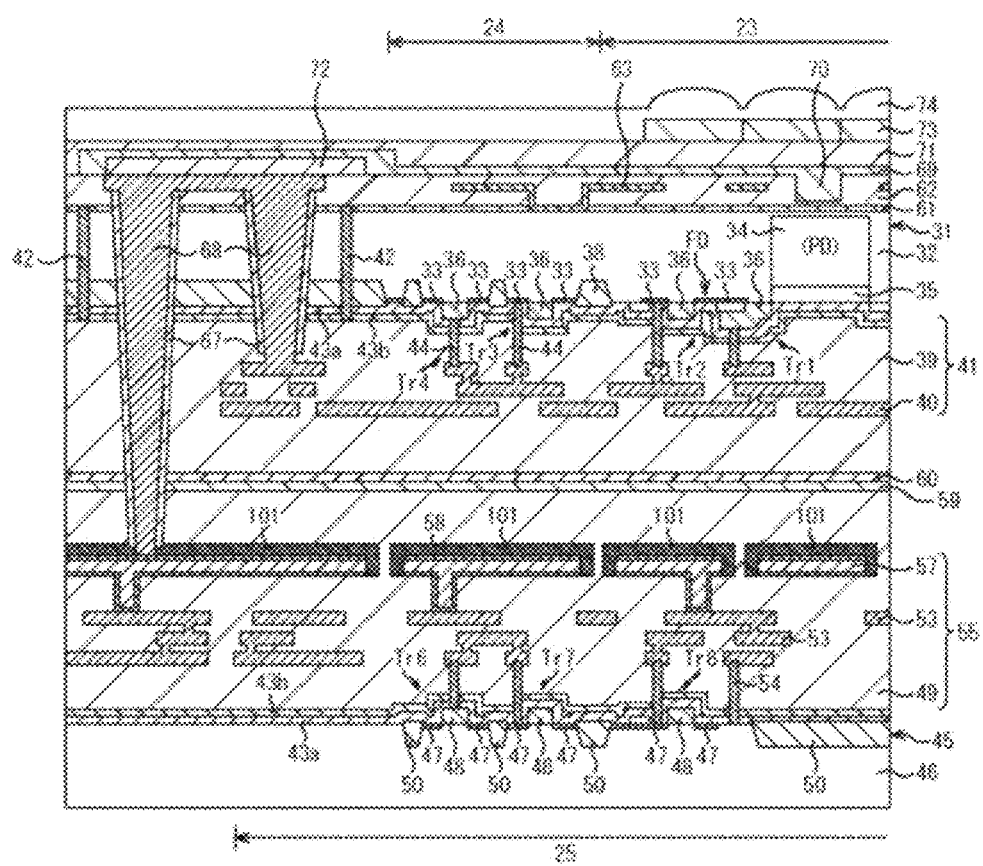
FIG. 9 is a sectional view depicting a configuration example of a solid-state imaging device according to a fifth embodiment.

FIG. 9 is a sectional view of a solid-state imaging device 1 according to a fifth embodiment of the present technology.

The solid-state imaging device 1 depicted in FIG. 9, fundamentally, has the same configuration as that of the solid-state imaging device 1 depicted in FIG. 3. In the solid-state imaging device 1 of FIG. 9, a second semiconductor wafer 45 is formed with a shield layer 101, in place of the shield layer 81 of FIG. 3.

Specifically, the shield layer 101 is formed in the second semiconductor wafer 45 in such a manner as to cover a wiring 57 from above (from a first semiconductor wafer 31 side).

Note that the shield layer 101 is formed in such a manner as to make contact with the wiring 57, but it may be formed in such a manner as not to make contact with the wiring 57.

According to such a configuration, a magnetic field generated at the wiring 57 serving as a power supply line of the second semiconductor wafer 45 is shielded by the shield layer 101, so that the magnetic field can be prevented from being exerted on a multilayer wiring layer 41 of the first semiconductor wafer 31. As a result, generation of noises in an image obtained can be avoided, and image quality can be enhanced.

Sixth Embodiment

Figure 10:
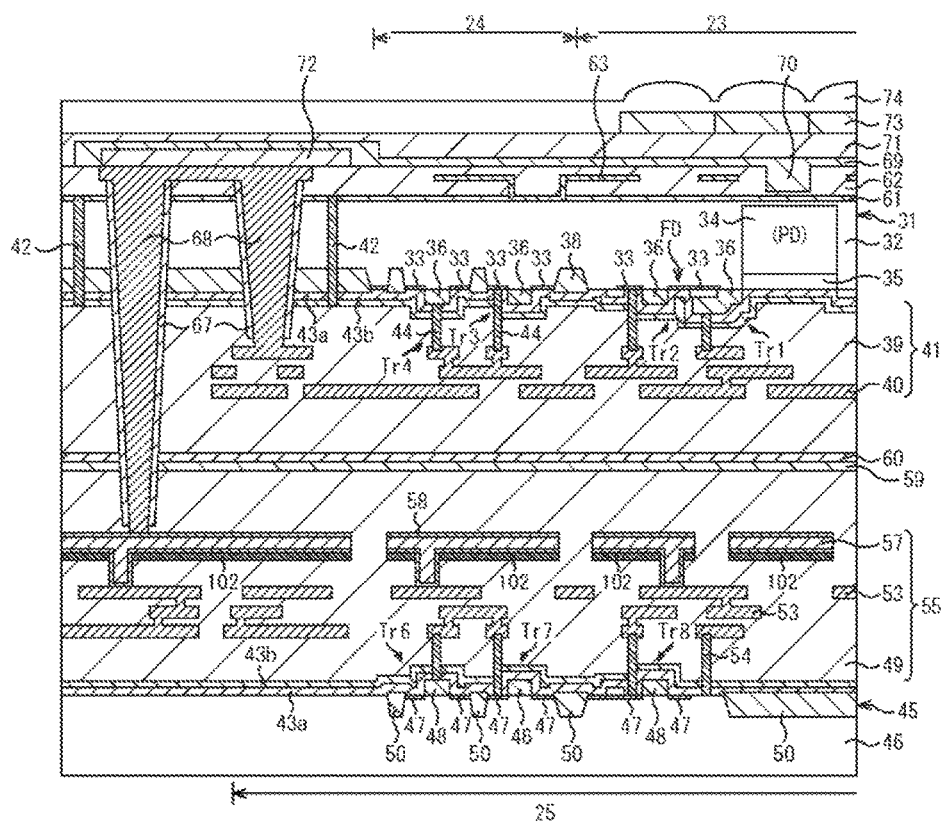
FIG. 10 is a sectional view depicting a configuration example of a solid-state imaging device according to a sixth embodiment.

FIG. 10 is a sectional view of a solid-state imaging device 1 according to a sixth embodiment of the present technology.

The solid-state imaging device 1 depicted in FIG. 10, basically, has the same configuration as that of the solid-state imaging device 1 depicted in FIG. 3. In the solid-state imaging device 1 of FIG. 10, a second semiconductor wafer 45 is formed with a shield layer 102, in place of the shield layer 81 of FIG. 3.

The shield layer 102 is formed in a layer lower than that of a wiring 57 in the second semiconductor wafer 45. Specifically, the shield layer 102 is formed in such a manner as to make contact with a lower surface of the wiring 57. In the second semiconductor wafer 45, a barrier metal layer 58 including a high-melting-point metal based on Ta, Ti or the like is formed in the state of being stacked on the shield layer 102.

Figure 11A:
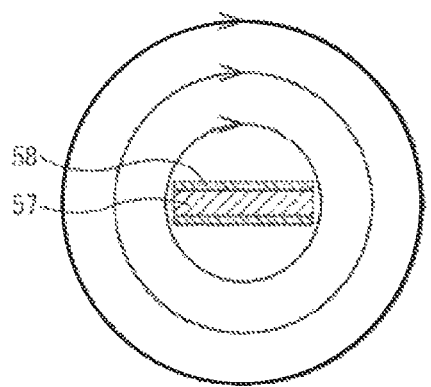
FIGS. 11A and 11B illustrate a magnetic field generated at a wiring.
Figure 11B:
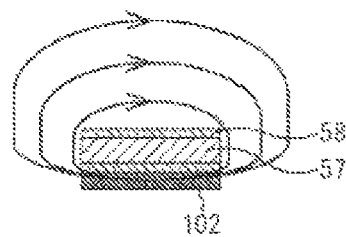

As depicted in FIG. 11A, in the case where the shield layer 102 is not provided as a layer lower than that of the wiring 57, a magnetic field generated at the wiring 57 describes a large loop. In view of this, the shield layer 102 is provided as a layer lower than that of the wiring 57, as depicted in FIG. 11B, with the result that the magnetic field generated at the wiring 57 describes a smaller loop.

According to such a configuration, a magnetic field generated at the wiring 57 serving as a power supply line of the second semiconductor wafer 45 is weakened by the shield layer 102, so that the magnetic field can be prevented from being exerted on a multilayer wiring layer 41 of a first semiconductor wafer 31. As a result, generation of noises in an image obtained can be obviated, and image quality can be enhanced.

Seventh Embodiment

Figure 12:
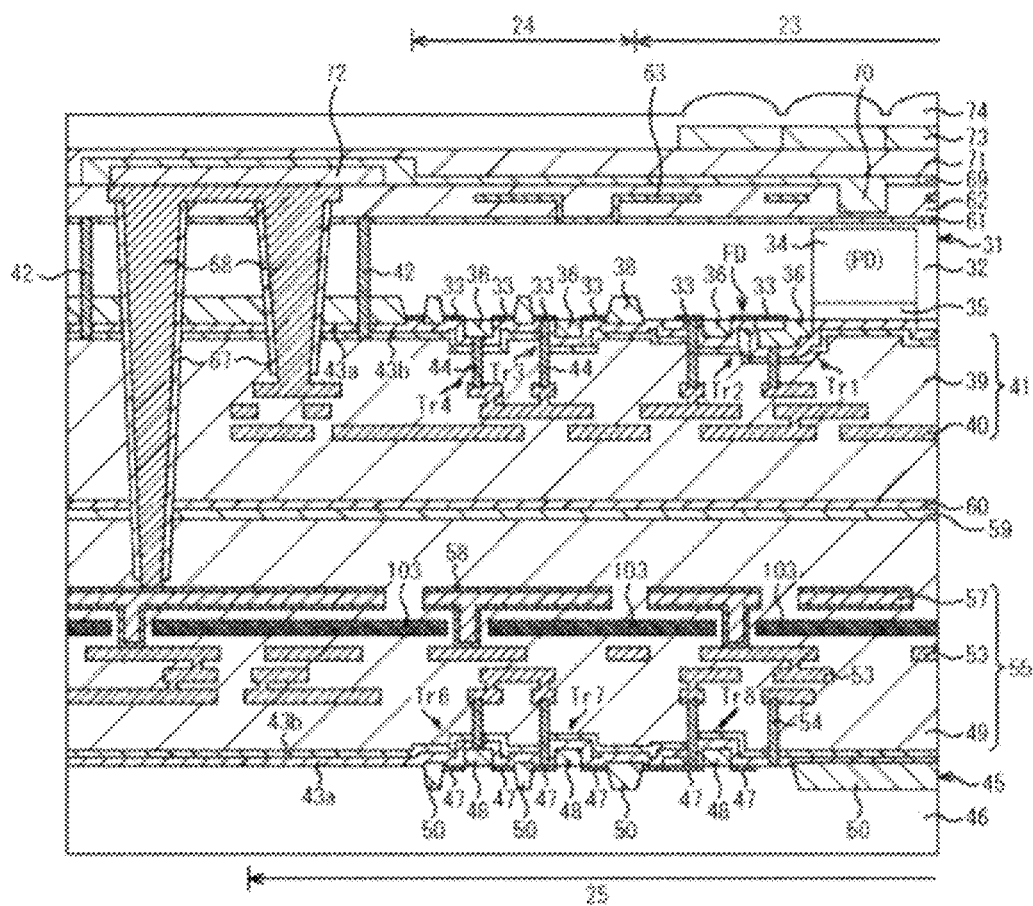
FIG. 12 is a sectional view depicting a configuration example of a solid-state imaging device according to a seventh embodiment.

FIG. 12 is a sectional view of a solid-state imaging device 1 according to a seventh embodiment of the present technology.

The solid-state imaging device 1 depicted in FIG. 12, fundamentally, has the same configuration as that of the solid-state imaging device 1 depicted in FIG. 3. In the solid-state imaging device 1 of FIG. 12, a second semiconductor wafer 45 is formed with a shield layer 103, in place of the shield layer 81 of FIG. 3.

The shield layer 103 is formed in a layer lower than that of a wiring 57 in the second semiconductor wafer 45. Specifically, the shield layer 103 is formed between the wiring 57 and wirings 53 in such a manner as not to be connected to the wiring 57 (as to be insulated from the wiring 57).

Note that the shield layer 103 may be formed in the state of being divided into a plurality of portions in the same layer, or may have holes formed in part thereof.

In the configuration of FIG. 12, also, the shield layer 103 is provided as a layer lower than that of the wiring 57, with the result that a magnetic field generated at the wiring 57 describes a smaller loop, like in the configuration of FIGS. 11A and 11B.

According to such a configuration, the magnetic field generated at the wiring 57 serving as a power supply line of the second semiconductor wafer 45 is weakened by the shield layer 103, so that the magnetic field can be prevented from being exerted on a multilayer wiring layer 41 of a first semiconductor wafer 31. As a result, generation of noises in an image obtained can be avoided, and image quality can be enhanced.

Eighth Embodiment

Figure 13:
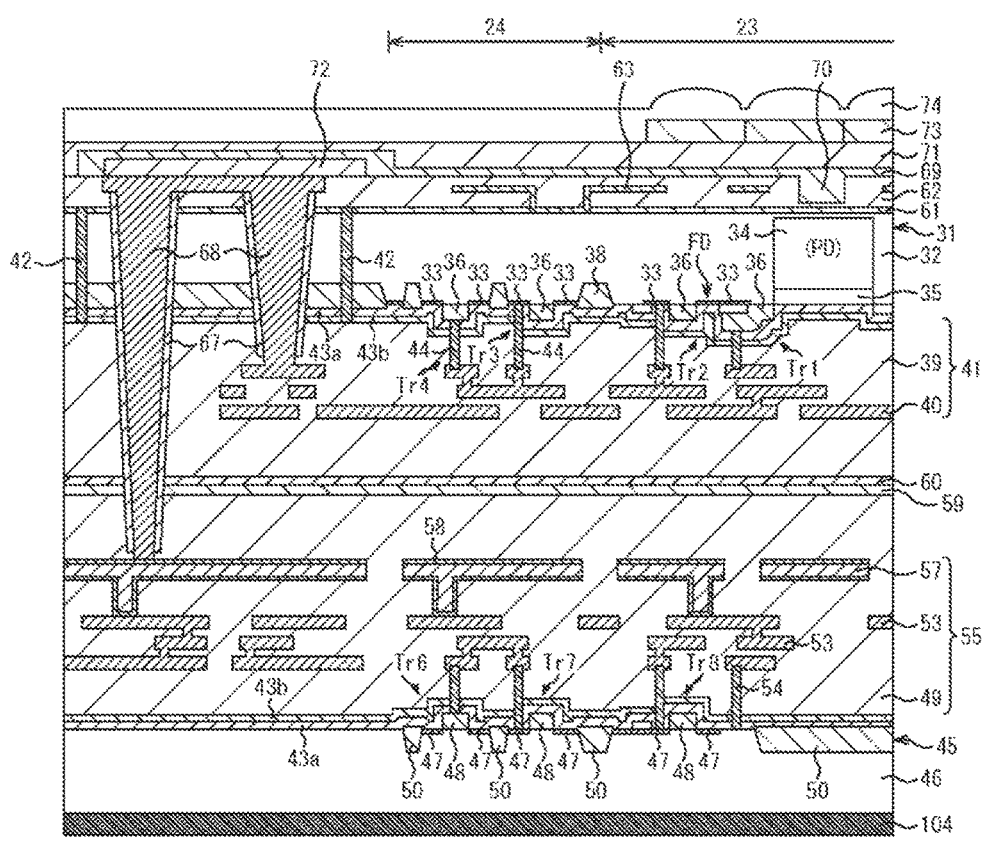
FIG. 13 is a sectional view depicting a configuration example of a solid-state imaging device according to an eighth embodiment.

FIG. 13 is a sectional view of a solid-state imaging device 1 according to an eighth embodiment of the present technology.

The solid-state imaging device 1 illustrated in FIG. 13, basically, has the same configuration as that of the solid-state imaging device 1 depicted in FIG. 3. In the solid-state imaging device 1 of FIG. 13, a second semiconductor wafer 45 is formed with a shield layer 104, in place of the shield layer 81 of FIG. 3.

The shield layer 104 is formed in the second semiconductor wafer 45 as a layer lower than that of a wiring 57. Specifically, the shield layer 104 is formed on the back side of a semiconductor well region 46.

In the configuration of FIG. 13, also, the shield layer 104 is provided as a layer lower than that of the wiring 57, with the result that a magnetic field generated at the wiring 57 describes a smaller loop, like in the configuration of FIGS. 11A and 11B. According to such a configuration, the magnetic field generated at the wiring 57 serving as a power supply line of the second semiconductor wafer 45 is weakened by the shield layer 104, so that the magnetic field can be prevented from being exerted on a multilayer wiring layer 41 of a first semiconductor wafer 31. As a result, generation of noises in an image obtained can be obviated, and image quality can be enhanced.

Note that while the shield layer has the function as a magnetic shield in the aforementioned embodiments, the shield layer may have a function as an electromagnetic shield. In that case, the shield layer is formed from an electrically conductive metal.

<Manufacturing Method of Solid-state Imaging Device>

Now, using FIGS. 14 to 17, manufacturing steps of a solid-state imaging device 1 according to the present technology will be described below. Here, the manufacturing steps of the solid-state imaging device 1 according to the first embodiment will be described as a representative of the solid-state imaging device 1 of the present technology.

First, a first semiconductor substrate is formed.

Figure 14:
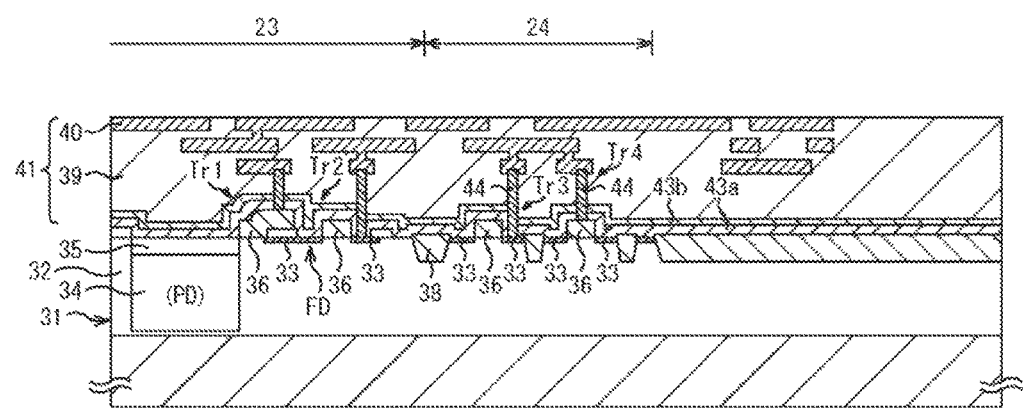
FIG. 14 illustrates a manufacturing step of a solid-state imaging device.

Specifically, as depicted in FIG. 14, an image sensor in a semi-product state, namely, a pixel region 23 and a control circuit 24 are formed in a region to be each chip section of a first semiconductor wafer (hereinafter referred to as the first semiconductor substrate) 31.

Specifically, a photodiode (PD) to be a photoelectric conversion section of each pixel is formed in the region to be each chip section of the first semiconductor substrate 31, which is a Si substrate. Then, source/drain regions 33 of pixel transistors are formed in a semiconductor well region 32. The semiconductor well region 32 is formed by introducing an impurity of a first conductivity type, for example, p-type, whereas the source/drain regions 33 are formed by introducing an impurity of a second conductivity type, for example, n-type. The PD and the source/drain regions 33 of the pixel transistors are formed by ion injection from the front surface of the substrate.

The PD is formed from an n-type semiconductor region 34 and a p-type semiconductor region 35 on the substrate front surface side. Gate electrodes 36 are formed on the substrate front surface for constituting the pixels with a gate insulating film therebetween. The gate electrodes 36 and the source/drain regions 33 paired therewith form pixel transistors Tr1 and Tr2. In FIG. 14, a plurality of pixel transistors are represented by the two pixel transistors Tr1 and Tr2. The pixel transistor Tr1 adjacent to the PD corresponds to a transfer transistor, and its source/drain region 33 corresponds to a floating diffusion (FD). Each pixel is separated by an element separation region 38.

On the other hand, on the control circuit 24 side, the first semiconductor substrate 31 is formed with MOS transistors for constituting the control circuit. In FIG. 14, the MOS transistors constituting the control circuit 24 are represented by MOS transistors Tr3 and Tr4. Each of the MOS transistors Tr3 and Tr4 is formed by an n-type source/drain region 33 and a gate electrode 36 formed with a gate insulating film therebetween.

Thereafter, an interlayer insulating film 39 is formed on the front surface of the first semiconductor substrate 31. Thereafter, the interlayer insulating film 39 is formed with connection holes, and connection conductors 44 connected to predetermined transistors are formed.

In forming the connection conductors 44, first, a first insulating thin film 43a is formed over the whole surface including transistor upper surfaces, by forming a silicon oxide film, for example. Next, a second insulating thin film 43b to be an etching stopper is formed and stacked, by forming a silicon nitride film, for example. Then, the interlayer insulating film 39 is formed on the second insulating thin film 43*b*.

Thereafter, connection holes differing in depth are selectively formed in the interlayer insulating film 39 to extend to the second insulating thin film 43*b* to be the etching stopper. Next, in such a manner as to be continuous with the connection holes, connection holes are formed by selective etching of the first insulating thin film 43*a* and the second insulating thin film 43*b*, which are the same in film thickness in each area. Then, the connection conductors 44 are buried in the connection holes.

Further, a plurality of layers (in this example, three layers) of wirings 40 are formed in such a manner as to be connected to the connection conductors 44 through the interlayer insulating film 39, whereby a multilayer wiring layer 41 is formed. The wirings 40 are composed of Cu wirings, for example. The pixel transistors of each pixel and the MOS transistors of the control circuit are connected to the required wirings 40 through the connection conductor 44. Note that while the wirings 40 are composed of Cu wirings in this example, the wirings 40 may be composed of metal wirings formed from other metallic material.

Figure 15:
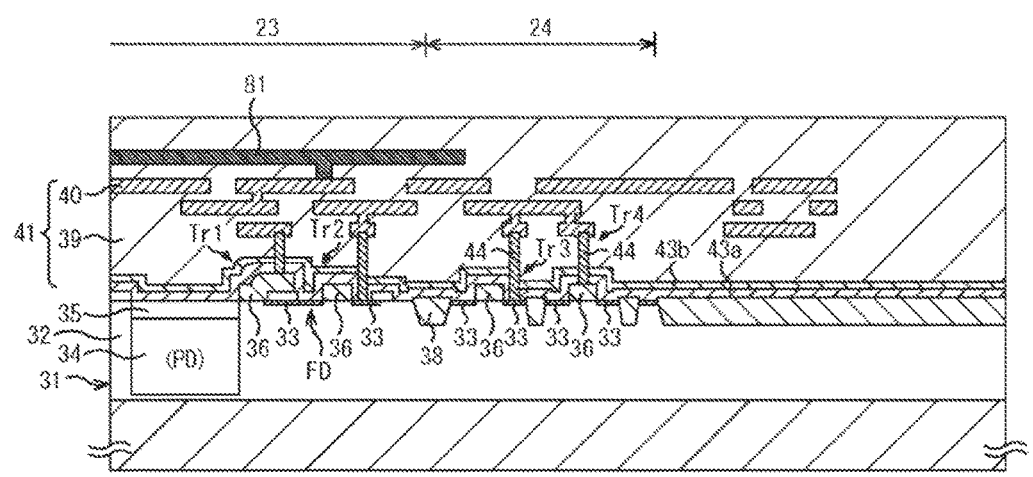
FIG. 15 illustrates a manufacturing step of the solid-state imaging device.

Thereafter, as depicted in FIG. 15, a shield layer 81 is formed on the upper side of the multilayer wiring layer 41 in such a manner as to cover the pixel region 23. In addition, as aforementioned, the shield layer 81 is formed as a monolayer film of permalloy, for example. Patterning of permalloy is conducted by a combination of photolithography and dry etching. Note that wet etching may be used in place of dry etching.

By the steps described above, the first semiconductor substrate 31 having the semi-product state pixel region 23 and control circuit 24 is formed.

Next, a second semiconductor substrate is formed.

Figure 16:
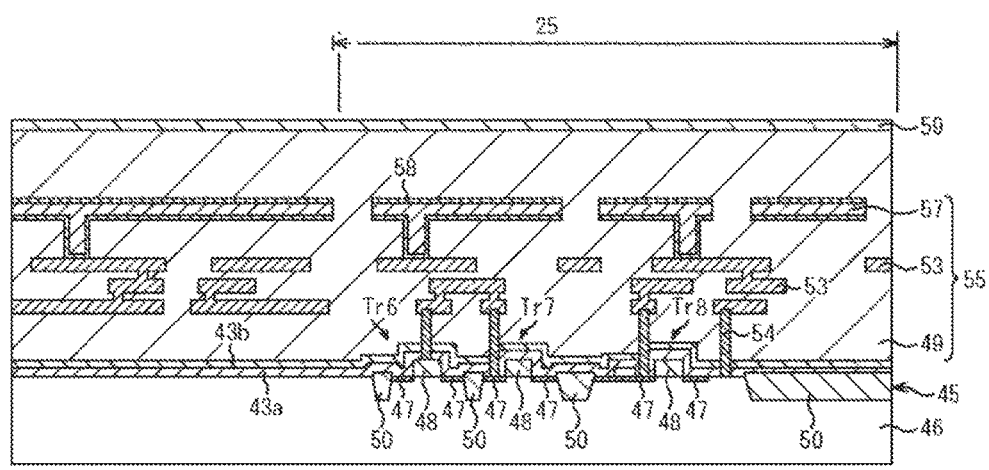
FIG. 16 illustrates a manufacturing step of the solid-state imaging device.

Specifically, as illustrated in FIG. 16, a logic circuit 25 including a signal processing circuit for signal processing, in a semi-product state, is formed in a region to be each chip section of a second semiconductor substrate (semiconductor wafer) 45, which is a Si substrate, for example.

Specifically, a plurality of MOS transistors constituting the logic circuit 25 are formed in a p-type semiconductor well region 46 on the front surface side of the second semiconductor substrate 45, in such a manner as to be separated by an element separation region 50. Here, the plurality of MOS transistors are represented by MOS transistors Tr6, Tr7 and Tr8. Each of the MOS transistors Tr6, Tr7 and Tr8 is formed to have an n-type source/drain region 47 and a gate electrode 48 formed with a gate insulating film therebetween, which are paired with each other. The logic circuit 25 can be constituted of CMOS transistors.

Next, an interlayer insulating film 49 is formed on the front surface of the second semiconductor substrate 45. Thereafter, the interlayer insulating film 49 is formed with connection holes, and connection conductors 54 connected to predetermined transistors are formed.

In forming the connection conductors 54, in the same manner as aforementioned, a first insulating thin film 43*a* is formed over the whole surface inclusive of transistor upper surfaces, by forming a silicon oxide film, for example. Next, a second insulating thin film 43*b* to be an etching stopper is formed and stacked, by forming a silicon nitride film, for example. Then, the interlayer insulating film 49 is formed on the second insulating thin film 43*b*.

Thereafter, connection holes differing in depth are selectively formed in the interlayer insulating film 49 to extend to the second insulating thin film 43*b* to be the etching stopper. Next, in such a manner as to be continuous with the connection holes, connection holes are formed by selective etching of the first insulating thin film 43*a* and the second insulating thin film 43*b*, which are the same in film thickness in each area. Then, the connection conductors 54 are buried in the connection holes.

Thereafter, the formation of the interlayer insulating film 49 and the formation of a plurality of layers of metal wiring are repeated, whereby a multilayer wiring layer 55 is formed. In this embodiment, three layers of wirings 53 and wiring 57 are formed in the same manner as in the step of forming the multilayer wiring layer 41 formed on the first semiconductor substrate 31. Note that the wirings 53 are composed of Cu wirings, for example, and the wiring 57 is composed of Al wiring, for example.

Then, a stress correction film 59 for reducing stress at the time of laminating the first semiconductor substrate 31 and the second semiconductor substrate 45 is formed over the multilayer wiring layer 55.

By the steps described above, the second semiconductor substrate 45 having the logic circuit in a semi-product state is formed.

Then, the first semiconductor substrate and the second semiconductor substrate are laminated.

Figure 17:
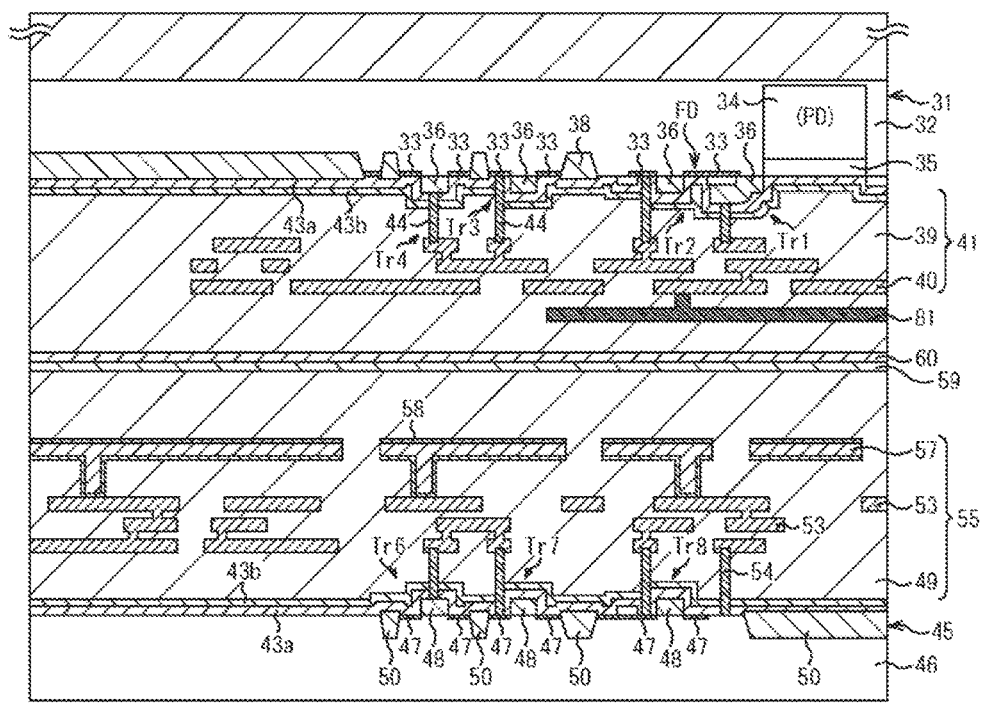
FIG. 17 illustrates a manufacturing step of the solid-state imaging device.

Specifically, as illustrated in FIG. 17, the first semiconductor substrate 31 and the second semiconductor substrate 45 are laminated, with their multilayer wiring layer 41 and multilayer wiring layer 55 facing each other. The lamination is conducted by use of an adhesive, for example. In the case of bonding with an adhesive, an adhesive layer 60 is formed on one side of bonding surfaces of the first semiconductor substrate 31 and the second semiconductor substrate 45. Then, the semiconductor substrates are laid on each other and bonded to each other, through the adhesive layer 60 therebetween. In this embodiment, the first semiconductor substrate 31 configured to have the pixel region 23 is disposed as an upper layer and the second semiconductor substrate 45 is disposed as a lower layer when they are laminated.

In addition, while the first semiconductor substrate 31 and the second semiconductor substrate 45 are laminated through the adhesive layer 60 therebetween in this embodiment, they may be laminated by other means such as plasma bonding.

In this way, the first semiconductor substrate 31 and the second semiconductor substrate 45 are laminated, whereby the laminated body including the two different substrates is formed.

Followingly, though not depicted, the first semiconductor substrate 31 is thinned, after which an anti-reflection film 61, an insulating film 62 and a light shielding film 63 are formed on a back side of a semiconductor well region 32.

Next, connection conductors 68 are formed.

Specifically, a connection hole is formed which penetrates the semiconductor well region 32 of the first semiconductor substrate 31 and reaches a desired wiring 40 in the multilayer wiring layer 41. Next, a connection hole is formed which penetrates the semiconductor well region 32 and the multilayer wiring layer 41 of the first semiconductor substrate 31 and reaches a desired wiring 57 in the multilayer wiring layer 55 of the second semiconductor substrate 45. Then, an insulating film 67 is formed in these connection holes. Thereafter, a metal is buried in the connection holes, whereby the connection conductors 68 are formed.

Thereafter, a waveguide path 70 formed of a waveguide path material film (for example, a SiN film or the like) 69 is formed in a region of the insulating film 62 that corresponds to the PD. In addition, a cap film 72 is formed on the upper side of the connection conductors 68. Further, a planarizing film 71, color filters 73 and on-chip microlenses 74 are formed.

Then, the laminated body formed by laminating the two semiconductor substrates is thereafter divided into chip sections by dicing, whereby the solid-state imaging devices 1 according to this embodiment are completed.

According to the treatments as above, the shield layer 81 is formed in such a manner that the pixel region 23 is hidden behind the shield layer 81 when viewed from the second semiconductor wafer 45 side. Therefore, a magnetic field generated at the wiring 57 serving as a power supply line of the second semiconductor wafer 45 is shielded by the shield layer 81, whereby the magnetic field can be prevented from being exerted on the multilayer wiring layer 41 of the first semiconductor wafer 31. As a result, generation of noises in an image obtained can be obviated, and image quality can be enhanced.

Note that the configuration for electrically connecting the first semiconductor substrate and the second semiconductor substrate is not limited to the above-described, and may be other configuration.

Besides, while the second semiconductor substrate including the logic circuit is configured as a single layer in the above description, the second semiconductor substrate may be composed of two or more layers. In other words, the present technology is also applicable to a solid-state imaging device having a laminated body composed of three or more layers wherein the first semiconductor substrate constitutes an uppermost layer.

Note that the present technology is not limited to the application to solid-state imaging devices, but is also applicable to imaging devices. The imaging devices here include camera systems, such as digital still cameras or digital video cameras, and electronic apparatuses having an imaging function, such as mobile phones. Note that a module form to be mounted on an electronic apparatus, namely, a camera module, may be the imaging device.

<Configuration Example of Electronic Apparatus>

Here, referring to FIG. 18, a configuration example of an electronic apparatus to which the present technology has been applied will be described.

Figure 18:
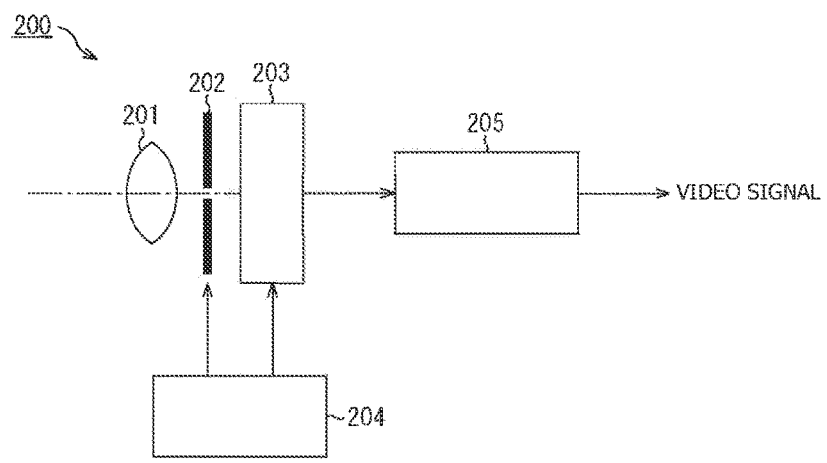
FIG. 18 is a block diagram depicting a configuration example of an electronic apparatus according to the present technology.

An electronic apparatus 200 depicted in FIG. 18 includes an optical lens 201, a shutter device 202, a solid-state imaging device 203, a driving circuit 204, and a signal processing circuit 205. In FIG. 18, an embodiment wherein the solid-state imaging device 1 according to the present technology as aforementioned is provided in an electronic apparatus (digital still camera) as the solid-state imaging device 203 is illustrated.

The optical lens 201 focuses image light (incident light) from a subject to form an image on an imaging surface of the solid-state imaging device 203. By this, signal charges are accumulated in the solid-state imaging device 203 for a predetermined period of time. The shutter device 202 controls light irradiation period and light shielding period for the solid-state imaging device 203.

The driving circuit 204 supplies driving signals to the shutter device 202 and the solid-state imaging device 203. The driving signal supplied to the shutter device 202 is a signal for controlling a shutter operation of the shutter device 202. The driving signal supplied to the solid-state imaging device 203 is a signal for controlling a signal transfer operation of the solid-state imaging device 203. The solid-state imaging device 203 transfers signals according to the driving signal (timing signal) supplied from the driving circuit 204. The signal processing circuit 205 performs various kinds of signal processing on a signal outputted from the solid-state imaging device 203. A video signal having undergone the signal processing is stored in a storage medium such as a memory and/or is outputted to a monitor.

In the electronic apparatus 200 according to this embodiment, image quality can be enhanced in the solid-state imaging device 203, and, as a result, it is possible to provide an electronic apparatus by which an image with high image quality can be obtained.

<Usage Examples of Image Sensor>

Lastly, usage examples of the image sensor to which the present technology has been applied will be described.

Figure 19:
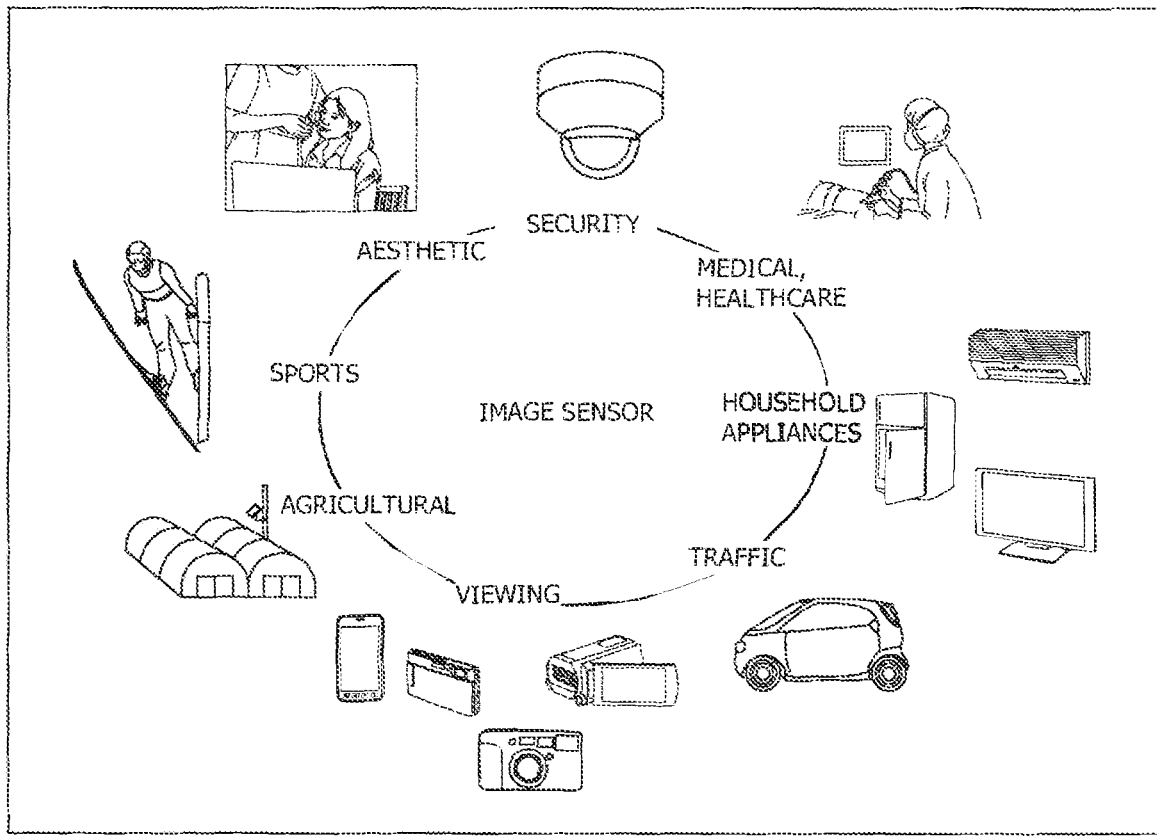
FIG. 19 illustrates usage examples in which an image sensor is used.

FIG. 19 illustrates usage examples of the aforementioned image sensor. The aforementioned image sensor can be used in various cases, for example, a case of sensing light such as visible light, infrared light, ultraviolet light, and X-rays as depicted below.

- Devices for picking up images for viewing use, such as digital cameras and portable apparatuses provided with a camera function
- Devices for traffic use, such as in-vehicle sensors for imaging the front side, the rear side, the surroundings, the interior, etc. of an automobile, a surveillance camera for monitoring a traveling vehicle or a road, a distance measurement sensor for performing measurement of the distance between vehicles and so forth for the purposes of safe driving such as automatic vehicle stop, recognition of the driver's condition, or the like
- Devices for use in household appliances such as TVs, refrigerators and air conditioners for the purpose of imaging a user's gesture and performing an apparatus operation according to the gesture
- Devices for medical or healthcare use, such as endoscopes and devices for imaging blood vessels by receiving infrared light
- Devices for security use, such as surveillance cameras for security and cameras for person authentification
- Devices for aesthetic use, such as a skin measuring instrument for imaging a skin and a microscope for imaging the scalp
- Devices for sports use, such as action cameras and wearable cameras for sports use or the like
- Devices for agricultural use, such as cameras for monitoring conditions of fields and/or farm products Note that the embodiments of the present technology are not limited to the above-described embodiments, and various modifications are possible without departing from the scope of the gist of the present technology.

Furthermore, the present technology can take the following configurations.

(1)

A solid-state imaging device including:
a pixel region in which a plurality of pixels are arranged;
a first wiring;
a second wiring; and
a shield layer,
wherein the second wiring is formed in a layer lower than that of the first wiring, and
the shield layer is formed in a layer lower at least than that of the first wiring.

(2)

The solid-state imaging device as described in (1), wherein the shield layer is formed from a material having a relative permeability of not less than 100.

(3)
The solid-state imaging device as described in (1) or (2), wherein the shield layer is formed between the first wiring and the second wiring.

(4)
The solid-state imaging device as described in (3), further including
a laminated body in which a first semiconductor substrate and one or more second semiconductor substrates are laminated, with the first semiconductor substrate as an uppermost layer,
wherein the first semiconductor substrate has the pixel region and the first wiring, and
the second semiconductor substrate has the second wiring and a logic circuit.

(5)
The solid-state imaging device as described in (4), wherein a fixed potential is impressed on the shield layer.

(6)
The solid-state imaging device as described in (4) or (5), wherein the shield layer
is formed in the first semiconductor substrate, and
is connected to a GND of the first semiconductor substrate.

(7)
The solid-state imaging device as described in (4) or (5), wherein the shield layer
is formed in the second semiconductor substrate, and
is connected to a GND of the second semiconductor substrate.

(8)
The solid-state imaging device as described in any one of (4) to (7),
wherein the first semiconductor substrate has a first electrode connected to the first wiring, on a surface on the second semiconductor substrate side,
the second semiconductor substrate has a second electrode connected to the second wiring, at a position on a surface on the first semiconductor substrate side which position corresponds to the first electrode,
the first electrode and the second electrode electrically connect the first semiconductor substrate and the second semiconductor substrate, and
the shield layer is formed in such a manner as to be penetrated by the first electrode or the second electrode.

(9)
The solid-state imaging device as described in any one of (4) to (7),
wherein the shield layer is formed in a flat film shape having an area substantially equal to or greater than that of the pixel region.

(10)
The solid-state imaging device as described in (4),
wherein the shield layer is formed in the second semiconductor substrate in such a manner as to cover the second wiring from above.

(11)
The solid-state imaging device as described in (1) or (2), wherein the shield layer is formed in a layer lower than that of the second wiring.

(12)
The solid-state imaging device as described in (11), wherein the shield layer is formed in such a manner as to make contact with a lower surface of the second wiring.

(13)
The solid-state imaging device as described in (11), wherein the shield layer is formed in a state of being divided into a plurality of portions in a same layer.

(14)
The solid-state imaging device as described in (11), wherein the shield layer has a hole formed in part thereof.

(15)
The solid-state imaging device as described in (1), wherein the shield layer has a function as an electromagnetic shield.

(16)
An electronic apparatus including
a solid-state imaging device which includes
a pixel region in which a plurality of pixels are arranged,
a first wiring,
a second wiring, and
a shield layer,
wherein the second wiring is formed in a layer lower than that of the first wiring, and
the shield layer is formed in a layer lower at least than that of the first wiring.

REFERENCE SIGNS LIST

1: Solid-state imaging device, 31: First semiconductor substrate, 40: Wiring, 41: Multilayer wiring layer, 45: Second semiconductor substrate, 53: Wiring, 55: Multilayer wiring layer, 57: Wiring, 81: Shield layer, 200: Electronic apparatus, 203: Solid-state imaging device

The invention claimed is:
1. A light detecting device, comprising:
a first semiconductor substrate including a plurality of pixels, a first wiring, and a first electrode connected to the first wiring;
a second semiconductor substrate including a logic circuit, a second wiring, and a second electrode connected to the second wiring, wherein
the second electrode is at a position on a surface of a first semiconductor substrate side of the second semiconductor substrate,
the position corresponds to the first electrode, and
the first electrode is electrically connected to the second electrode;
a first shield layer between the first wiring and the second wiring,
wherein the first shield layer is electrically connected to a fixed potential; and
a conductor electrically connected to the plurality of pixels and the logic circuit.

2. The light detecting device according to claim 1, wherein
the first wiring is in a first layer and the second wiring is in a second layer, and
the second layer is lower than the first layer.

3. The light detecting device according to claim 1, further comprising a laminated body that includes the first semiconductor substrate as an uppermost layer and the second semiconductor substrate.

4. The light detecting device according to claim 1, wherein the first shield layer is, above the second wiring, in the second semiconductor substrate.

5. The light detecting device according to claim 1, wherein
the first shield layer includes permalloy and one of a Tantalum-based metal or a Titanium-based metal, and
a relative permeability of the permalloy is greater than 100.

6. The light detecting device according to claim 1, wherein
the first shield layer has a flat film shape, and
the first shield layer has an area greater than an area of a pixel region of the plurality of pixels.

7. The light detecting device according to claim 1, wherein the first shield layer is divided into a plurality of portions.

8. The light detecting device according to claim 1, wherein a part of the first shield layer includes a cavity.

9. The light detecting device according to claim 1, wherein the first shield layer is an electromagnetic shield.

10. The light detecting device according to claim 1, wherein the first shield layer is in contact with a lower surface of the second wiring.

11. An electronic apparatus, comprising:
a light detecting device which includes:
a first semiconductor substrate including a plurality of pixels, a first wiring, and a first electrode connected to the first wiring;
a second semiconductor substrate including a logic circuit, a second wiring, and a second electrode connected to the second wiring, wherein
the second electrode is at a position on a surface of a first semiconductor substrate side of the second semiconductor substrate,
the position corresponds to the first electrode, and
the first electrode is electrically connected to the second electrode;
a first shield layer between the first wiring and the second wiring,
wherein the first shield layer is electrically connected to a fixed potential; and
a conductor electrically connected to the plurality of pixels and the logic circuit.

* * * * *